United States Patent
Arik et al.

(10) Patent No.: US 7,135,863 B2
(45) Date of Patent: Nov. 14, 2006

(54) THERMAL MANAGEMENT SYSTEM AND METHOD FOR MRI GRADIENT COIL

(75) Inventors: Mehmet Arik, Niskayuna, NY (US); Bulent Aksel, Clifton Park, NY (US); William Dwight Gerstler, Niskayuna, NY (US); Cherik Bulkes, Sussex, WI (US); Douglas Arthur Kelley, San Mateo, CA (US); Steven Joseph Brzozowski, Scotia, NY (US)

(73) Assignee: General Electric Company, Niskayuna, NY (US)

( * ) Notice: Subject to any disclaimer, the term of this patent is extended or adjusted under 35 U.S.C. 154(b) by 36 days.

(21) Appl. No.: 10/955,635

(22) Filed: Sep. 30, 2004

(65) Prior Publication Data

US 2006/0066309 A1 Mar. 30, 2006

(51) Int. Cl.
*G01V 3/00* (2006.01)
(52) U.S. Cl. ...................................... 324/318
(58) Field of Classification Search .................. 324/318
See application file for complete search history.

(56) References Cited

U.S. PATENT DOCUMENTS

| 2,385,542 A | * | 9/1945 | Rippingille | ............ | 29/890.043 |
| 2,695,368 A | * | 11/1954 | Kilbourne | ................... | 310/64 |
| 5,414,399 A | | 5/1995 | Breneman et al. | | |
| 5,554,929 A | * | 9/1996 | Doty et al. | ................... | 324/318 |
| 6,111,412 A | * | 8/2000 | Boemmel et al. | ........... | 324/318 |
| 6,154,110 A | | 11/2000 | Takeshima | | |
| 6,552,545 B1 | * | 4/2003 | Kaindl et al. | ................ | 324/318 |
| 6,741,152 B1 | * | 5/2004 | Arz et al. | .................... | 335/300 |
| 6,774,631 B1 | * | 8/2004 | Heid | ........................... | 324/318 |
| 2002/0148604 A1 | * | 10/2002 | Emeric et al. | .............. | 165/206 |
| 2003/0010485 A1 | * | 1/2003 | Goldman et al. | ........... | 165/183 |
| 2003/0015316 A1 | * | 1/2003 | Burkay | ........................ | 165/179 |
| 2005/0093543 A1 | * | 5/2005 | Arik et al. | ................... | 324/318 |

FOREIGN PATENT DOCUMENTS

| WO | WO 94/20862 | 9/1994 |
| WO | WO 03/050555 | 6/2003 |

* cited by examiner

*Primary Examiner*—Diego Gutierrez
*Assistant Examiner*—Megann E. Vaughn
(74) *Attorney, Agent, or Firm*—Fletcher Yoder

(57) ABSTRACT

A thermal management system and method for cooling Magnetic Resonance Imaging gradient coils. The system includes least one first header tube positioned adjacent to said gradient coils and configured to transport a coolant fluid; at least one set of cooling tubes connected to said header tube at inlet ends and configured to transport said coolant fluid, wherein said cooling tubes are parallel to each other and at least one second header tube positioned adjacent to said gradient coils, connected to said at least one set of cooling tubes at outlet ends of said at least one set of cooling tubes and configured to transport said coolant fluid.

60 Claims, 5 Drawing Sheets

THERMAL MANAGEMENT SYSTEM AND METHOD FOR MRI GRADIENT COIL

BACKGROUND

The present invention relates generally to magnetic resonance imaging (MRI), and more particularly, to a system and method of enhanced thermal management of a gradient coil assembly in an MRI system.

Generally, MRI is a well-known imaging technique. A conventional MRI system establishes a homogenous magnetic field, for example, along an axis of a person's body that is to undergo MRI. This homogeneous magnetic field conditions the interior of the person's body for imaging by aligning the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of radio frequency (RF) pulses. During the realignment process, the nuclei process about the axis of the magnetic field and emit electromagnetic signals that may be detected by one or more gradient coils placed on or about the person.

As well known in the MRI industry, high power MRI systems consume large amounts of electrical power. In particular, the gradient and RF coils consume excessive amounts of power and thus these coils generate significant heat typically on the order of tens of kilowatts. As one would expect, excessive heat can cause system components to deteriorate or fail prematurely and hence adversely affects reliability. Moreover, rise in temperatures causes a reduction in coil currents and low coil currents affects signal generation, resulting in poor image resolution. In addition, heat can be an annoyance to a patient during the imaging process and, if excessive, could injure a patient. For this reason there are regulations that stipulate the maximum temperature of a patient support table that effectively limit the amount of power that can be used in any MRI system.

One way to minimize heat is to provide a hermetically sealed liquid cooling system with cooling conduits adjacent the gradient coils. According to solutions of this ilk, during field generation and data acquisition liquid coolant (e.g., water) is pumped through the system to cool the coils. Liquid cooling offers effective cooling of the system and the components and therefore can have higher currents and cooling efficiency as compared to other cooling systems like an air-cooled system.

Current cooling circuits based on liquid cooling method in MRI gradient coils are of serpentine scheme with either copper tubes or lengthy plastic tubes. One of the problems of the long cooling tubes is that it introduces large pressure drops. In addition, there is another limitation on the number of tubes that can be deployed in the radial direction at a given radius around the perimeter of the coil due to practical limitations in bending the tube. Higher image quality MRI machines require higher power density and higher power density increases heat generation. The heat must be effectively removed. A typical MRI system generates heat loads of 10–18 kW depending on the field strength. For example, a high-end 7 Tesla (7T) system generates about 17 kW of heat or more depending on the pulsing mode.

Moreover, serpentine cooling passages traverse through the gradient coils several times before the heat can be removed from the coolant. In addition, the serpentine cooling tubes as found commonly are mostly made from copper or aluminum tubes or similar metals due to high thermal conductivity, low cost and availability reasons. Due to likeliness of the eddy loops in presence of a magnetic field, the metallic material may give rise to continuous eddy loops in the cooling tubes. Therefore, it is necessary to have an electrical break in the cooling system. Due to low coverage area of the serpentine cooling, constriction resistance is higher and it is more prone to have temperature non-uniformities and local hot spots. In addition, there is high vibration associated with the operation of a higher field strength MRI system and from a structural point of view, a change from the serpentine cooling scheme is needed. There is need of an enhanced thermal management of the MRI system. This new system will provide both lower spreading resistance and higher cooling capacity.

It would therefore be desirable to design an enhanced method and system to maintain gradient coil temperature within a specified range regardless of the selected excitation applied, thereby enabling higher power applications for faster imaging with improved image quality and longer scan times.

BRIEF DESCRIPTION

Briefly, in accordance with one embodiment of the invention, there is provided a thermal management system for cooling Magnetic Resonance Imaging gradient coils. The system includes at least one first header tube positioned adjacent to the gradient coils and configured to transport a coolant fluid. The system also includes at least one set of cooling tubes connected to the first header tube at inlet ends and configured to transport the coolant fluid. The cooling tubes are parallel to each other. The system also includes at least one second header tube positioned adjacent to the gradient coils, connected to the at least one set of cooling tubes at outlet ends of the at least one set of cooling tubes and configured to transport the coolant fluid.

In accordance with another embodiment of the invention, there is provided a magnetic resonance imaging system. The system includes a gradient coil system, at least one first header tube positioned adjacent to the gradient coils and configured to transport a coolant fluid, at least one set of cooling tubes connected to the first header tube at inlet ends and configured to transport the coolant fluid. The cooling tubes are parallel to each other. The system also includes at least one second header tube positioned adjacent to the gradient coils, connected to the at least one set of cooling tubes at outlet ends of the at least one set of cooling tubes and configured to transport said coolant fluid.

In accordance with another embodiment of the invention, a thermal management method is provided for cooling Magnetic Resonance Imaging gradient coils. The method includes positioning at least one first header tube adjacent to the gradient coils, connecting at least one set of cooling tubes to the at least one first header tube at the inlet ends. The at least one set of cooling tubes are parallel to each other. The method also includes positioning at least one second header tube adjacent to the gradient coils, connecting the at least one second header tube to the at least one set of cooling tubes at outlet ends of the at least one set of cooling tubes and cycling a coolant fluid through the at least one first header tube, the at least one set of cooling tubes and said at least one second header tube.

These and other features, aspects, and advantages of the present invention will become better understood when the following detailed description is read with reference to the accompanying drawings in which like characters represent like parts throughout the drawings.

DRAWINGS

The foregoing and other advantages and features of the invention will become apparent upon reading the following detailed description and upon reference to the drawings in which.

DETAILED DESCRIPTION

Figure 1:
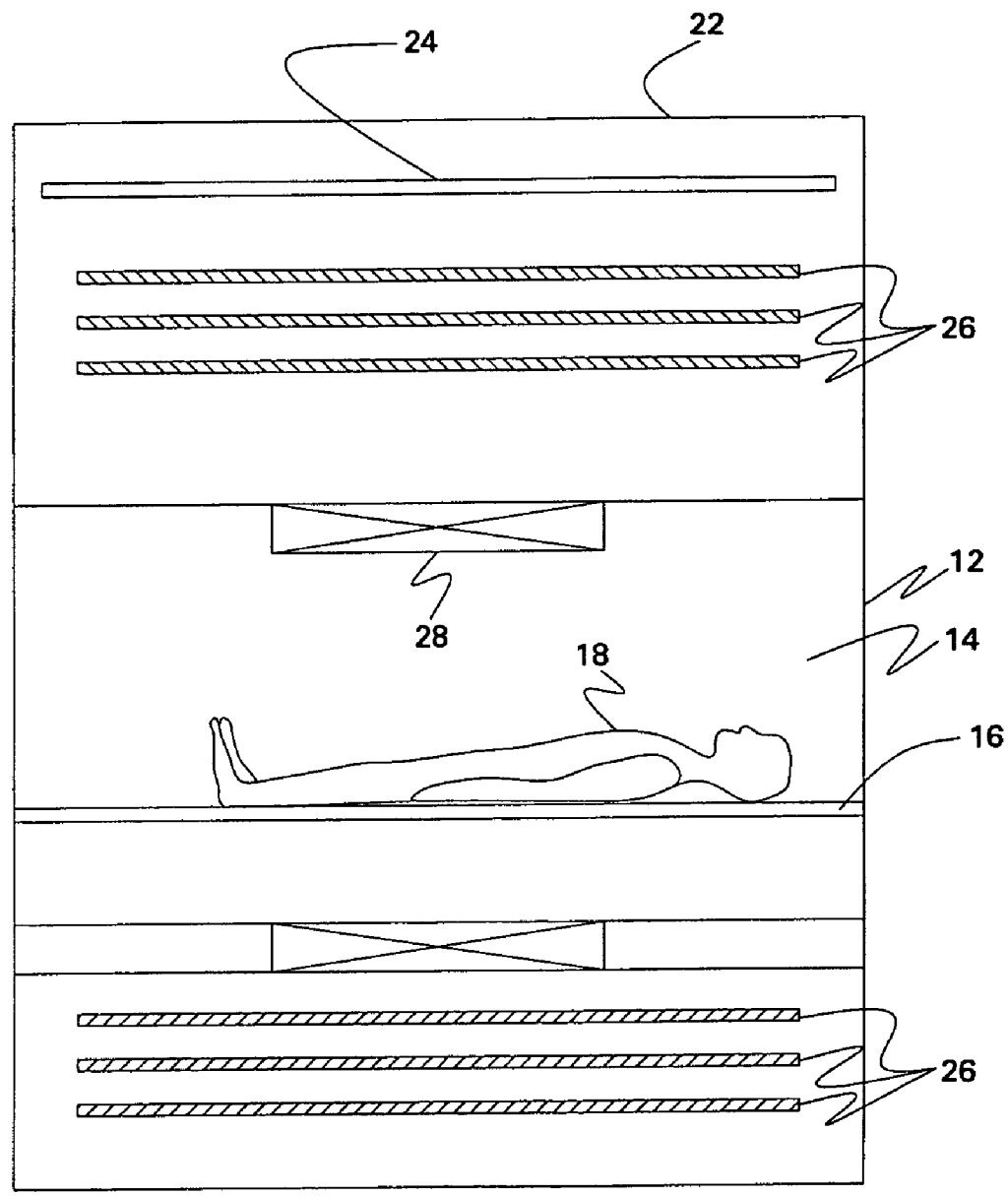
FIG. 1 is an illustration of an exemplary MRI system to which embodiments of the present invention are applicable.

Referring first to FIG. 1, there is shown the major components of a commonly deployed conventional MRI system 10 as found in prior art, which incorporates the present invention. To this end the components illustrated include a scanner 12. While MRI system 10 may include any suitable MRI scanner or detector, in the illustrated embodiment the system includes a full body scanner comprising a patient bore 14 into which a table 16 may be positioned to place a patient 18 in a desired position for scanning. Scanner 12 may be of any suitable type of rating, including scanners varying from 0.5 Tesla ratings to 1.5 Tesla ratings and beyond up to 7 Tesla.

Scanner 12 includes a series of associated coils for producing controlled magnetic fields, for generating radiofrequency (RF) excitation pulses, and for detecting emissions from gyromagnetic material within the patient in response to such pulses. In the diagrammatical view of FIG. 1, a primary magnet coil 24 is provided for generating a primary magnetic field generally aligned with patient bore 14. A series of gradient coils 26 are grouped in a coil assembly for generating controlled magnetic gradient fields during examination sequences as described more fully below. A radiofrequency coil 28 is provided for generating radiofrequency pulses for exciting the gyromagnetic material.

In the configurations illustrated in FIG. 1, coil 28 also serves as a receiving coil. Thus, RF coil 28 may be coupled with driving and receiving circuitry in passive and active modes for receiving emissions from the gyromagnetic material and for applying radiofrequency excitation pulses, respectively. Alternatively, various configurations of receiving coils may be provided separate from RF coil 28. Such coils may include structures specifically adapted for target anatomies, such as head coil assemblies, and so forth. Moreover, receiving coils may be provided in any suitable physical configuration, including phased array coils, and so forth.

In the present configuration, the gradient coils 26 have different physical configurations adapted to their function in the imaging system 10. As will be appreciated by those skilled in the art, the coils are comprised of conductive wires, bars or plates, which are wound, or cut to form a coil structure which generates a gradient field upon application of control pulses as described below. The placement of the coils within the gradient coil assembly may be done in several different orders, but in the present embodiment, a Z-axis coil is positioned at an innermost location, and is formed generally as a solenoid-like structure, which has relatively little impact on the RF magnetic field. Thus, in the illustrated embodiment, the inner most gradient coil 26 is the Z-axis solenoid coil, while the intermediate coil 26 and the outer most coil 26 are Y-axis and X-axis coils respectively. Current design is not limited to coil locations and placements. Depending on the magnetic design, the coils can also be placed such that the X-axis coils are at the innermost location, the Y-axis coils are at the middle, and the Z-axis coils are at the outer most location. Based on the design, certain radial distances inside the coil are allocated for placement of cooling tubes. Based on the thermal management requirement, a gradient coil may have single or multiple thermal subsystems in the coil at various radial distances from the center.

The coils of scanner 12 are controlled by an external circuitry (not shown) to generate desired fields and pulses, and to read signals from the gyromagnetic material in the patient's body in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an RF pulse is generated at or near a Larmor frequency of the material of interest, resulting in rotation of the net aligned moment to produce a net transverse magnetic moment. This transverse magnetic moment precesses around the main magnetic field direction, emitting RF signals that are detected by the scanner and processed for reconstruction of the desired image.

Gradient coils 26 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils 26 have mutually orthogonal axes for the direction of their variation, enabling a linear field gradient to be imposed in an arbitrary direction with an appropriate combination of the three gradient coils 26.

The MRI system 10 includes imaging volume 22 for a subject, such as, a patient 18, to be placed to undergo an imaging session. The imaging volume is defined to house the gradient coils 26 and the RF coils 28. As indicated previously, the gradient coils 26 are excited by a corresponding gradient amplifier to produce magnetic field gradients used for spatially encoding signals acquired by the RF coils used to reconstruct an image in a known manner. When generating the magnetic field gradients, the gradient coils 26, as a result of the resistive effects of their copper composition, generate considerable heat, typically on the order of tens of kilowatts, which must be dissipated to ensure proper operation of the MRI system 10. Dissipating heat generated within an MRI system 10 is paramount to avoid overheating and potential damage to the gradient coils.

The present invention provides a system and method to improve heat removal from the gradient coils 26 of an MRI imaging system while maintaining internal and external temperatures below maximum operating limits, thereby enabling higher power applications for faster imaging with improved image quality as well as, allowing longer scan times for interventional procedures. In addition, the invention provides a system and method to maintain uniform temperature and eliminate hot spots in the gradient coils 26 and thereby the reliability of the MRI imaging system increases.

Figure 2:
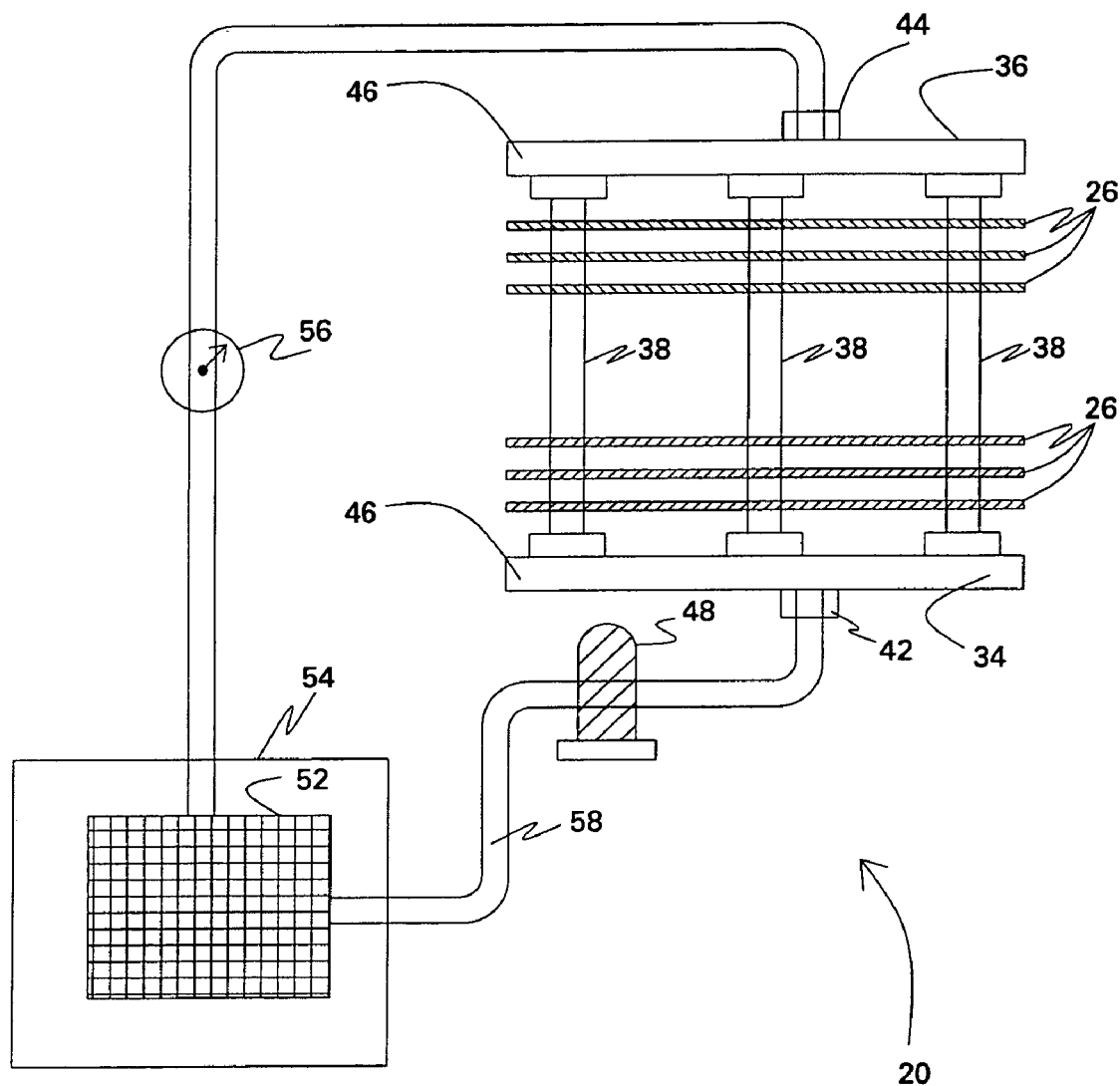
FIG. 2 is a schematic diagram of a thermal management system for cooling Magnetic Resonance Imaging gradient coils constructed in accordance with an exemplary embodiment of the invention.

FIG. 2 is a schematic diagram of a thermal management system for cooling Magnetic Resonance Imaging gradient coils 26 constructed in accordance with an exemplary embodiment of the invention. Referring to FIG. 2, the thermal management system 20 is provided and configured to reduce heat generated by the gradient coils 26 of the MRI system 10.

To assist in dissipation of heat generated by the gradient coils 26, a coolant 58 is circulated through a set of cooling tubes 38 passing through the imaging volume 22, as will be discussed shortly. The advantages of a system that can employ a liquid coolant 58 are many and include, among others, enhanced patient comfort, increased RF currents, increased system performance in terms of resolution, a reduced size as air ducts required by prior air cooled systems can be eliminated, and greater overall system efficiency. The liquid coolant 58 in one embodiment of the invention is water only. In another embodiment of the invention the liquid coolant 58 is a water-ethylene-glycol-mixture, a water-propylene-glycol mixture, or any heat transfer fluid.

Referring to FIG. 2 again, cold coolant 58 is introduced on one side of the gradient coils 26 through a first header tube 34. A header tube is also known as a manifold. The cooling tubes 38 are parallel to each other in azimuthal direction. And each of them joins the first header tube 34 at a "T" joint 46 and then runs through the gradient coils 26. While the first header tube 34 is acting as a supply manifold, a second header tube 36 works as the discharge manifold from the gradient coil. The second header tube 36 on the opposite side of the gradient coils 26 collects the coolant 58. As the coolant 58 passes through the cooling tubes 38 running through the gradient coils, it absorbs heat, thus removing heat from the gradient coils 26. The heat is conducted through the gradient coils 26, through the walls of the cooling tube 38, and then convected into the coolant 58. The system also requires a means to pump the coolant 58 and to remove the heat from the coolant 58. Typically, a coolant pump 48 and a heat exchanger 52 located in a remote chiller 54 are used.

The parallel cooling scheme described above provides tremendous cooling power to the gradient coils 26. The flow of coolant 58 may be controlled typically with a metering orifice or a pressure transducer or any other pressure measurement device 56. This would give selective flow distribution and heat transfer characteristics in the cooling circuit. Increased capacity to cool the gradient coils 26 due to lower temperatures of coolant 58 increases the effectiveness of the parallel configuration. It should be appreciated that the size and number of tubes of the cooling tubes 38 depends on many heat transfer design details including, but not limited to, overall size, flow rate and resistance, materials, and the heat load of the MRI system 10.

The invention is not limited to the above-described configuration of the header tubes 34, 36 and the cooling tubes 38. In one embodiment of the invention one single header tube 34 and parallel tubes 38 are connected by brazed or welded or soldered or glued joints. In another embodiment of the invention, each of the parallel tubes 38 may have its own supply header tube. Each of these parallel tubes 38 is connected with its header tube by non conductive joining pieces. In yet another embodiment of the invention, the header tubes 34, 36 are made up of non conductive materials such as plastic or ceramic materials.

Figure 3:
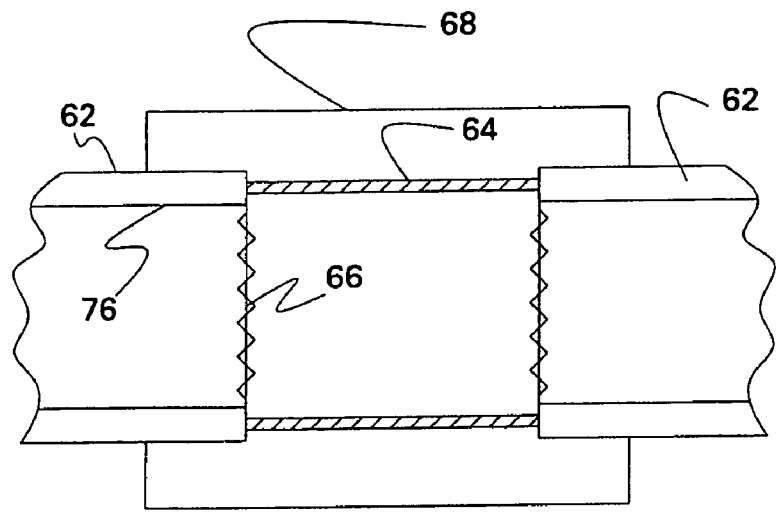
FIG. 3 is a longitudinal section of a cooling tube in accordance with an exemplary embodiment of the invention.
Figure 4:
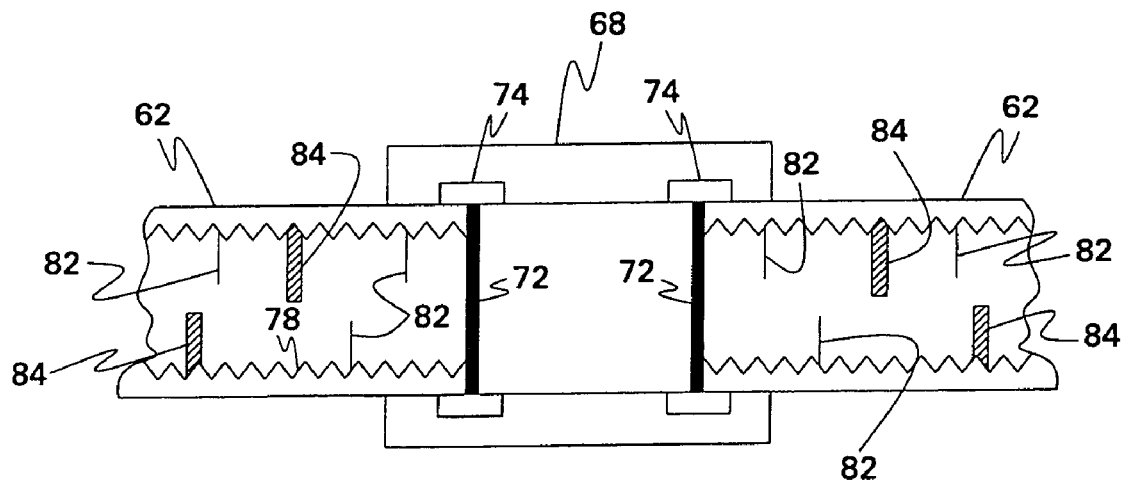
FIG. 4 is a longitudinal section of a cooling tube in accordance with another embodiment of the invention.

Structural details of the cooling tubes 38 are illustrated in FIG. 3 and FIG. 4. Structurally, the cooling tubes 38 are typically made from copper or aluminum tubes or plates, or similar metals due to high conductivity, low cost and availability reasons. Due to the likely eddy loops in presence of a magnetic field, the metallic material may give rise to continuous eddy loops in the cooling tubes. Therefore, it is necessary to have an electrical break in the cooling system as illustrated in FIG. 3 and FIG. 4. FIG. 3 is a longitudinal section of a cooling tube in accordance with one exemplary embodiment of the invention. In this embodiment of the invention, as shown in FIG. 3, the cooling tubes 38 have metal and non-metal union pieces 68 in the middle. The union pieces 68 include two flat or plate type metallic tube pieces 62 joined by a non-metallic mid piece 64. In one embodiment of the invention, the non-metallic mid-piece 64 can be machined from plastic material like lexan, G10, acrylic or any similar material. In another embodiment of the invention, an off-the-shelf PVC type of tube can be used. In both cases a threaded joint 66 is constructed between metal tubes pieces 62 and the non-metallic mid-piece 64. In this embodiment of the invention, the cooling tubes 38 have smooth straight walls 76. In another embodiment of the invention, the non-metallic mid-piece 64 and the threaded joint may 66 not be used. In this embodiment of the invention, the union piece 68 may be a non-conductive hose, which is clamped in between the two headers.

FIG. 4 is a longitudinal section of a cooling tube in accordance with another embodiment of the invention. In this embodiment of the invention, as shown in FIG. 4, non-metallic unions 68 are used to connect the metallic tube pieces 62. The unions 68 have glued joint 72 and O-rings 74 for eliminating leakage of coolant 58. The cooling tubes 38 are brazed to the end header tubes at joints 46 of FIG. 2. Additional plastic piece at the header tube is used to break the circumferential electrical continuity is also added. In another embodiment, machined or molded plastic header tubes are used in which the tubes 38 are attached to the first header tube 34 or the second header tube 36 through threaded holes. In this embodiment of the invention, the cooling tubes 38 have rough straight walls 78. In another embodiment of the invention, there may be concavities in the walls 78 or 76. In yet another embodiment of the invention, additional heat transfer enhancements are attached to the inside walls 78 of the cooling tubes 38. The heat transfer enhancements typically include internal fins 82 of various configurations (straight, helical, etc.), baffles 84, pin fins (not shown) etc.

In yet another embodiment of the invention, micro channel cold plate technology (not shown) is implemented in place of cooling tubes 38. According to this embodiment of the invention, each cold plate has a header tube and the cold plates are connected to each other via a plastic hose or a machined mid piece. The hose can be clamped or glued to the header tube. In another embodiment of the invention, a single non-metallic header tube can hold together all of the cold plates. In yet another embodiment of the invention, the use of additional tubing through the gradient coils 26 is eliminated. In this embodiment, a grooved backing plate (not shown) holds together a number of cooling channels. The backing plate is usually made of a plastic material, FR4, G10, GRP or something similar. Structurally, the cooling channels open up in the plastic plate and the plastic plates eliminate the interface resistances otherwise present between tube to cold structure as well as convection resistance between coolant 58 and tube walls 76 or 78. In another embodiment of the invention, the cooling channels may be coated with impervious material for resistance against surface to coolant 58 chemical interactions.

Figure 5:
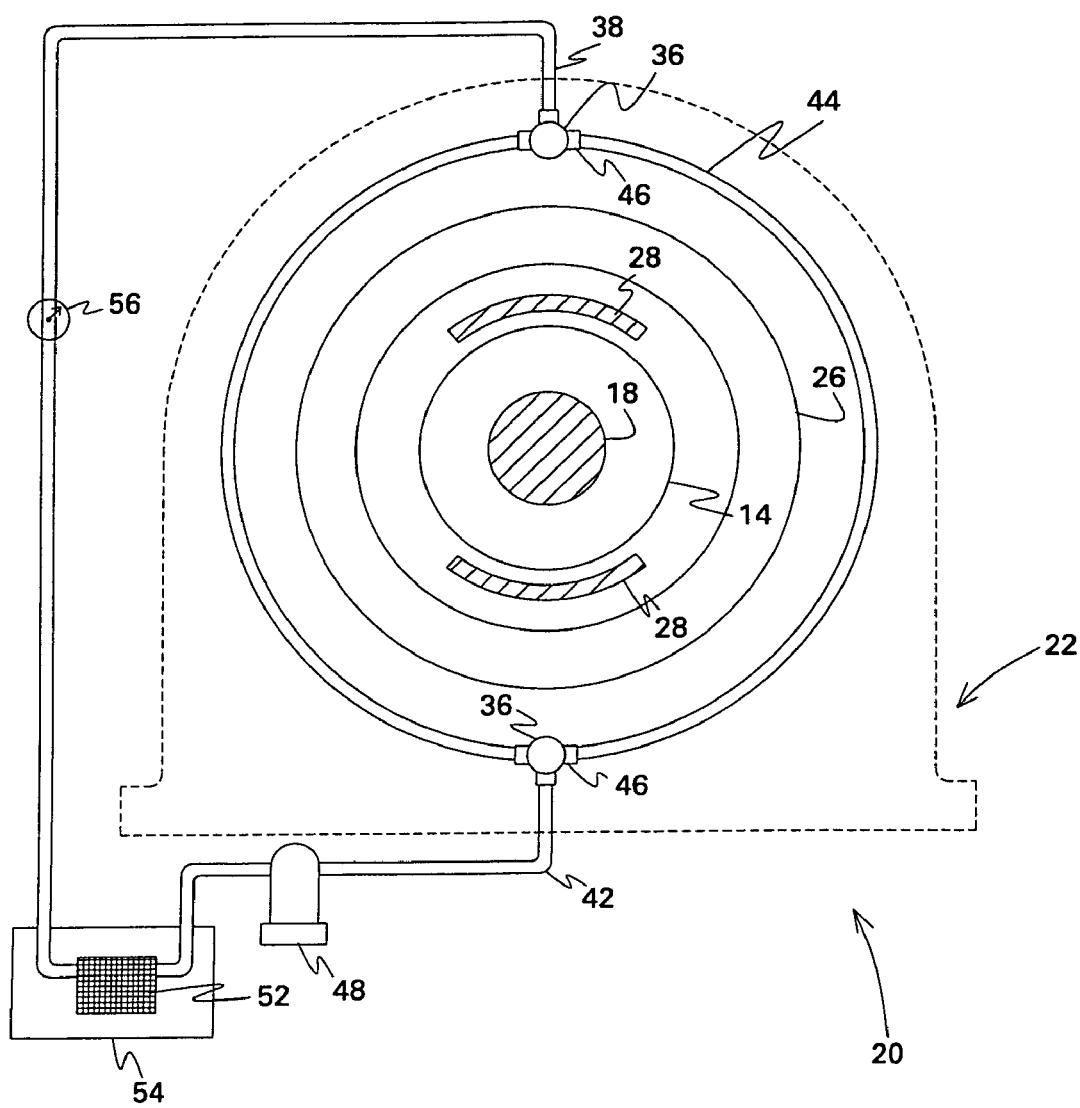
FIG. 5 is a cross-section of a cooling tube assembly of the thermal management system in accordance with another embodiment of the invention and FIG. 6 illustrates a method for cooling Magnetic Resonance Imaging gradient coils in accordance with an exemplary embodiment of the invention.

In operation, the series of cooling tubes 38 are hermetically sealed and are interspersed within each of the gradient coils 26. Each tube 38 is linked to the pump 48 and the heat exchanger 52 via the first header tube 34 and the second header tube 36, respectively, to form a closed circuit from the exchanger 52 through the pump 48 to the gradient coils 26 and back again to the exchanger 52. FIG. 5 is a cross-section of a cooling tube assembly of the thermal management system 20 in accordance with an embodiment of the invention. Because of the relative positions of the first header tube 34 and the second header tube 36 and the smaller diameter of the cooling tubes 38, the inlet pressure at each cooling tube 38 is about the same. This assures that coolant 58 flows in equal volume in the same direction through each of the tubes 38. The cooling tubes 38 pass through the gradient coil 26 at a location adjacent to the areas of highest heat generation. The heat flows through various surfaces in the gradient coils 26 in conduction heat transfer mode and through the walls 76 and 78 of the cooling tubes 38. The coolant 58 passing through the cooling tubes 38 absorbs the heat from the cooling tube walls 76 and 78 in convection heat transfer mode. During the process, the coolant's temperature increases. It exits the gradient coils 26 into the second header 36. The heat is removed from the coolant 58 using the heat exchanger 52 and power is provided to move the coolant 58 using the pump 48.

The parallel geometry of the cooling tubes 38 allows the coldest coolant 58 to simultaneously pass through the cooling tubes. The temperature difference between the heated gradient coils 26 and the coolant 58 is the primary driver of heat transfer. When the coolant 58 passes through the gradient coils 26 in series as is found in the serpentine systems of prior art, it continues to get heated up, thus reducing the heat transfer and/or increasing the temperature of the gradient coils 26. The parallel configuration of the thermal management system 20 on the other hand, in accordance with one embodiment of this invention, assures colder coolant 58. The temperature gradients in the gradient coils 26 is reduced using the parallel cooling geometry. The temperature gradient of the coolant 58 is reduced, thus the temperature gradient of the gradient coils 26 is reduced.

In another embodiment of the invention, with dual parallel cooling tubes 38 are used so that there are two flows of the coolant 58 in opposite directions. This results in lower temperature gradient as compared to the embodiments described above. In this embodiment, there are two sets of first and second headers 34 and 36 and a number of parallel cooling tubes 38. Cold coolant 58 enters the first headers 34 at the bottom and the pressure is evenly distributed throughout the header. Then the cold coolant 58 passes through the heated area, which is adjacent to the gradient coils 26. The coolant 58 absorbs heat and its temperature rises. The second headers 36 collect the coolant 58. In this embodiment, the thermal management system 20 shown in FIG. 2 is duplicated in an opposite direction. This allows the temperature gradient of the gradient coils 26 to be very small. As the coolant 58 flows in one direction its temperature increases. At the same time, a nearby coil has coolant 58 flow in the opposite direction. Near the edges of the gradient coil, the hottest coolant 58 is exiting near a place where the coolest coolant 58 is entering. This helps reduce the overall temperature gradient in the gradient coils 26.

Referring back to FIG. 5, cooling is provided by circulating the coolant 58 through the MRI system 10, where cold coolant 58 exchanges heat with the gradient coils 26 using the cooling tubes 38, and returns back to the heat exchanger 52 at a higher temperature. As known, design options for heat exchanger 52 are limited on the types of materials employable therein due, in part, to the extreme thermal operating conditions. The use of non-metallic "eddy current free" materials is also limited. Hence, the heat exchanger 52 is preferably positioned external to the MRI system 10 as shown in FIG. 2. This isolates the heat exchanger 52 from the fluctuating electric and magnetic fields generated by the MRI system 10, thereby preventing generation of eddy currents within the heat exchanger 52. Circulation of the coolant 58 is generated by utilizing the difference in gravitational forces between the cold and the warm ends, or alternatively by way of a pump 48.

Still referring to FIG. 5 and as indicated previously, condensation may form on the surface of the gradient coils in response to the circulation of coolant 58 that is below the ambient dew point if not for a consistent vacuous state within imaging volume 22. Coolant 58 enters the imaging volume 22 through first header 34. Coolant 58 is fed to the imaging volume 22 by a coolant pump 48, which is fluidly connected to first header 34 through external fluid tube 42 and to second header 36 through external fluid tube 44. To assist in maintaining the desired coolant temperature, cooling tubes 42 and 44 are sufficiently insulated to limit any variance in coolant temperature as it enters imaging volume 22. Although one first header tube 34 and one second header tube 36 for the coolant are shown in FIG. 5, in other embodiments, there may be just one header tube, since the cooling tubes 38 are circular around the imaging volume 22. In another embodiment there may be more than two header tubes to provide more consistent flow circulation.

Continuing to refer to FIG. 5, coolant pump 48 circulates coolant 58 at a temperature dependent on what the MRI system 10 needs and, in accordance with one embodiment of the invention, at a coolant temperature independent of the dew point temperature of the ambient. By removing any moisture in the imaging volume 22, the coolant 58 may be input through tubes 42 and 44 at any desired temperature. Coolant 58 entering the imaging volume 22 travels through cooling tubes 38 and while doing so, absorbs heat from the gradient coils 26. The coolant 58 carrying the heat entrained therein away from the gradient coils 26 exits the imaging volume 22 through second header tubes 36 which transports the heated coolant 58 to a chiller 54 and a heat exchanger 52 through return tubes 44. Chiller 54 is configured to dissipate heat absorbed in the coolant 58 using the heat exchanger 52 and a compressor (not shown) in a known technique and lower the temperature of the coolant.

Operation of chiller 54 is controlled by a control unit (not shown) to drive the temperature of the liquid coolant 58 to a desired value. Regulation of the coolant temperature in accordance with the present invention allows for dynamic adjusting of the coolant temperature to keep the table 18 surface and other temperatures in the imaging volume 22, such as, the surface temperature of the warm patient bore 14 adjacent to the imaging volume 22, within specified limits. That is, if the heat dissipation requirements increase, the temperature of the coolant 58 may be decreased below the dew point temperature if necessary. Further, if the heat or power dissipation needs are reduced, the temperature of the coolant 58 may be allowed to increase thereby decreasing the amount of energy exerted by the chiller 54. As a result, down times of the MRI system 10 to allow the system to cool are avoided, and further, the MRI system 10 may be implemented with applications and imaging sequences requiring higher power input to the gradient coils 26.

Referring back to FIG. 5 one embodiment of the invention utilizes metering orifice 56 to control flow distribution within the cooling circuit of the MR system 10. Alternatively or in conjunction with temperature adjustment, as the need to dissipate heat from the gradient coils 26 changes, the control unit may also adjust the flow rate of coolant pump 48 to increase or decrease temperatures in the MR system 10 to a desired temperature. Furthermore, the temperature, pressure, and the flow rate sensed by the flow meter 56 may also be implemented to trigger the control unit to disable the drivers of the gradient coil 26 if an anomalous condition is detected.

Accordingly and in a further embodiment of the present invention, a thermal management system and method is provided to regulate the temperature of the imaging volume 22 within desired operating limits by determining a coolant inlet pressure and/or flow rate prior to, and in proportion with, the power requirements of an impending patient scan profile. The coolant inlet pressure and flow rate are adjusted to ensure that at least a temperature are maintained within acceptable limits.

In yet another embodiment of the invention, in the system 20 of FIG. 5, the gradient coil 26 may have multiple thermal management subsystems (not shown) for enhanced cooling. There are four header tubes positioned at four radial distances R1, R2, R3 and R4 (not shown). The header tube at R1 is the innermost header tube, the header tube at R2 is the second innermost header tube, the header tube at R3 is the second outermost header tube and the header tube at R4 is the outermost header tube. In one thermal management subsystem, coolant 58 enters from the header tube at R1 and travels parallel to the z-axis and then comes back either from the header tube at R3 or the header tube at R4. In one thermal management subsystem, coolant 58 enters from the header tube at R2, travels parallel to the z-axis and then comes back either from the header tube at R3 or the header tube at R4. There are many other possible design choices depending on different combinations of the inlet and the outlet header tubes. A specific combination may be chosen based on the thermal requirements of the gradient coil 26 and relevant hydraulic diameters of all the header tubes are determined for proper design. Overall thermal spreading resistance of the system 20 is substantially decreased due to much higher cooling channel area covered by the various thermal management subsystems.

The thermal management subsystems can be further embodied based on which side of the gradient coil 26 the header tubes 34 and 36 are positioned on, relative to each other. In one embodiment of the invention, the first or supply header tube 34 is at one end of the gradient coil 26, known as 'service end'. The second or discharge header tube 36 is positioned at the other end of the gradient coil 26, known as 'patient end'. In another embodiment of the invention, both the supply and the discharge header tubes are in the same end (service or patient end). In both the embodiments of the invention, the first or the supply header tube 34 enables distribution of coolant 58 in the thermal management subsystems, while the second or the discharge header tube 36 collects the coolant 58 from the system 20.

Figure 6:
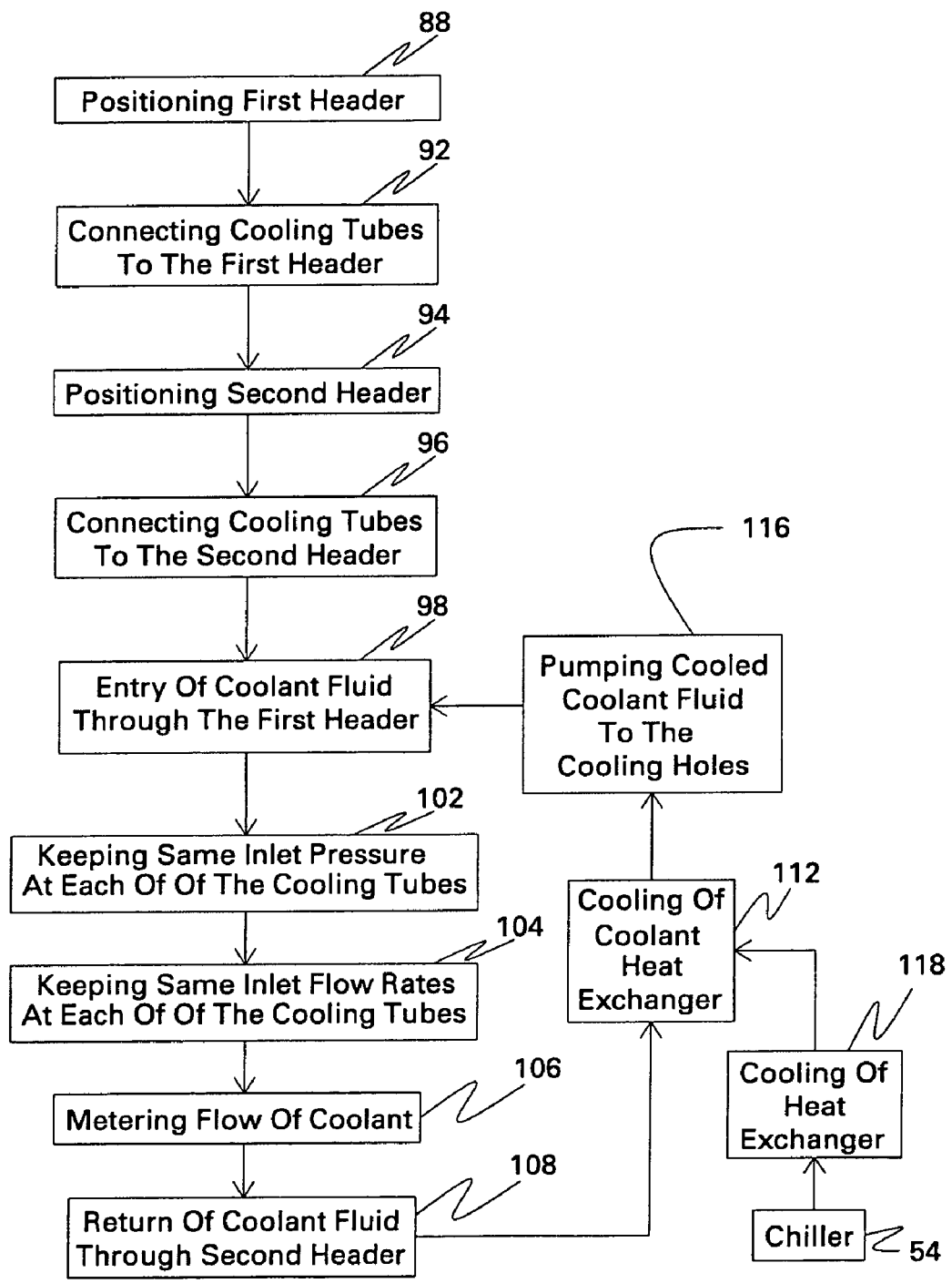

Referring now to FIG. 6, an exemplary method for cooling electrical coils in MRI system 10 is provided in accordance with one embodiment of the present invention. To this end, beginning at block 88, a first header tube 34 is positioned and a set of cooling tubes 38 are connected to the first header tube 34 at their inlet ends as illustrated in block 92. Continuing, at block 94, a second header tube 36 is positioned and connected to the outlet ends of the set of cooling tubes 38. Next, at block 98, cold coolant 58 enters the cooling tubes 38 through the first header tube 34. At block 102, inlet pressure is kept at same value in each of the cooling tubes 38 and at block 104, flow rate is kept at same value in each of the cooling tubes 38. Continuing, at block 106, the flow rate of the coolant 58 is metered using the metering system 56. The coolant 58 returns to the cooling tubes 38 through the second header 36 at block 108. All through the operation of the thermal management system 20, cooling of the cyclic flow of coolant 58 continues. At block 112, coolant 58 is cooled in heat exchanger 52 and at block 116 the cooled coolant 58 is pumped back to the cooling tubes 38. At block 118, the heat exchanger 52 is further cooled by the chiller 54.

In yet another embodiment of the present invention, an MRI system 10 is provided that includes a plurality of gradient coils 26. The gradient coils 26 are configured to be positioned about a patient bore 14 of a permanent magnet 24 to impress a polarizing magnetic field. The system also includes at least one first header tube 34 positioned adjacent to the gradient coils 34 and configured to transport the coolant 58, at least one set of cooling tubes 38 connected to the first header tube 34 at inlet ends and configured to transport the coolant 58. The cooling tubes 38 are parallel to each other. There is least one second header tube 36 positioned adjacent to the gradient coils 26, connected to the at least one set of cooling tubes 38 at second header ends of the at least one set of cooling tubes 38 and configured to transport said coolant 58.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A thermal management system for cooling Magnetic Resonance Imaging gradient coils, comprising:
   at least one first header tube positioned adjacent to said gradient coils and configured to transport a coolant fluid;
   at least one set of cooling tubes connected to said header tube at inlet ends and configured to transport said coolant fluid, wherein said cooling tubes are parallel to each other, at least one cooling tube of said at least one set of cooling tubes comprising metallic tube segments, and at least one non-metallic segment connected between the metallic tube segments to reduce eddy current in the at least one set of cooling tubes;
   at least one second header tube positioned adjacent to said gradient coils, connected to said at least one set of cooling tubes at outlet ends of said at least one set of cooling tubes and configured to transport said coolant fluid.

2. The system according to claim 1 further comprising a coolant pump, wherein said pump is configured to cycle said coolant through said first header tube, said at least one set of cooling tubes and said second header tube.

3. The system according to claim 1 further comprising a heat exchanger, wherein said heat exchanger is configured to transfer heat from said coolant fluid to a working fluid of a chiller.

4. The system according to claim 3, wherein said chiller is configured to remove heat from said coolant fluid using said heat exchanger.

5. The system according to claim 1, wherein each of said at least one set of cooling tubes is configured to maintain an inlet pressure of substantially same magnitude compared to any other of said at least one set of cooling tubes.

6. The system according to claim 1, wherein each of said at least one set of cooling tubes is configured to maintain a flow rate of said coolant of substantially same magnitude compared to any other of said at least one set of cooling tubes.

7. The system according to claim 1, wherein said at least one set of cooling tubes are positioned at locations adjacent to areas corresponding to higher relative heat generation location of said gradient coils.

8. The system according to claim 1, wherein said at least one set of cooling tubes are further configured to have smooth and straight walls.

9. The system according to claim 1, wherein said at least one set of cooling tubes are further configured to have at least one of rough walls or walls with concavities.

10. The system according to claim 1, wherein said at least one set of cooling tubes comprises flat tubes.

11. The system according to claim 10, wherein said flat tubes comprise flat tubes with micro-channels.

12. The system according to claim 10, wherein each flat tube further comprises a non-metallic tube segment.

13. The system according to claim 1, wherein each metallic tube segment comprises at least one of copper or aluminum tube segment.

14. The system according to claim 1, further comprising at least two unions configured to connect each metallic tube segment and said at least one non-metallic segment.

15. The system according to claim 14, wherein said union further comprises at least one threaded joint.

16. The system according to claim 14, wherein said union further comprises at least one O-ring.

17. The system according to claim 1, further comprising glues configured to connect said metallic tube segments and said at least one non-metallic segment.

18. The system according to claim 1, further comprising at least two sets of joints configured to connect said at least one set of cooling tubes and at least one of said at least one first header tube or at least one second header tube.

19. The system according to claim 18, wherein said joint further comprises at least one plastic piece configured to break a circumferential electrical continuity through said cooling tubes.

20. The system according to claim 18, wherein said joints further comprise at least one of brazed, welded, soldered or glued joints.

21. The system according to claim 18, wherein said joint further comprises threaded holes.

22. The system according to claim 1, wherein said at least one set of cooling tubes are further configured to be electrically isolated by having non-conductive transition pieces.

23. The system according to claim 1, wherein said at least one set of cooling tubes are further configured to have at least one heat transfer enhancement feature.

24. The system according to claim 23, wherein said heat transfer enhancement feature comprises at least one of a plurality of internal fins, a plurality of baffles and a plurality of pin fins.

25. The system according to claim 24, wherein said internal fins comprise at least one of straight or helical internal fins.

26. The system according to claim 1 further comprising a cold plate micro-channel cooling assembly comprising:
a plurality of micro-channels configured to cool said gradient coil and
at least two header tubes connected to said plurality of micro-channels.

27. The system according to claim 26 further comprising at least two sets of plastic hoses configured to connect said plurality of micro-channels and said at least two header tubes.

28. The system according to claim 27, wherein said plastic hose is glued to said header tube.

29. The system according to claim 27, wherein said plastic hose is threaded to said header tube.

30. The system according to claim 26 further comprising at least two sets of mid-pieces configured to connect said plurality of micro-channels and said at least two header tubes.

31. The system according to claim 30 further comprising backing plates configured to reduce thermal contact resistance between said plurality of micro-channels and said mid-pieces.

32. The system according to claim 31, wherein said backing plates comprise grooved backing plates.

33. The system according to claim 31, wherein said backing plates comprise plastic backing plates.

34. The system according to claim 30 further comprising at least one metering orifice configured to control a flow of said coolant fluid.

35. The system according to claim 1 further comprising a thermal management subsystem.

36. The system according to claim 35, wherein said first header tube and said second header tube are positioned on a same side of said gradient coil.

37. The system according to claim 35, wherein said first header tube and said second header tube are positioned on an opposite side of said gradient coil.

38. The system according to claim 35, wherein said coolant fluid is distributed in said thermal management subsystem based on thermal requirement of said gradient coil.

39. A magnetic resonance imaging system comprising:
a gradient coil system;
at least one first header tube positioned adjacent to said gradient coils and configured to transport a coolant fluid;
at least one set of cooling tubes connected to said header tube at inlet ends and configured to transport said coolant fluid, wherein said cooling tubes are parallel to each other, at least one cooling tube of said at least one set of cooling tubes comprising metallic tube segments, and at least one non-metallic segment connected between the metallic tube segments to reduce eddy current in the at least one set of cooling tubes; and
at least one second header tube positioned adjacent to said gradient coils, connected to said at least one set of cooling tubes at outlet ends of said at least one set of cooling tubes and configured to transport said coolant fluid.

40. The system according to claim 39 further comprising a coolant pump, wherein said pump is configured to cycle said coolant through said first header tube, said at least one set of cooling tubes and said second header tube.

41. The system according to claim 39 further comprising a heat exchanger, wherein said heat exchanger is configured to transfer heat from said coolant fluid to a working fluid of a chiller.

42. The system according to claim 41 further comprising a chiller, wherein said chiller is configured to remove heat from said coolant fluid using said heat exchanger.

43. The system according to claim 39, wherein each of said at least one set of cooling tubes is configured to maintain an inlet pressure of substantially same magnitude compared to any other of said at least one set of cooling tubes.

44. The system according to claim 39, wherein each of said at least one set of cooling tubes is configured to maintain a flow rate of said coolant of substantially same magnitude compared to any other of said at least one set of cooling tubes.

45. The system according to claim 39, wherein said at least one set of cooling tubes are positioned at locations adjacent to areas corresponding to higher relative heat generation location of said gradient coils.

46. The system according to claim 39 further comprising a thermal management subsystem.

47. The system according to claim 46, wherein said first header tube and said second header tube are positioned on a same side of said gradient coil.

48. The system according to claim 46, wherein said first header tube and said second header tube are positioned on an opposite side of said gradient coil.

49. The system according to claim 46, wherein said coolant fluid is distributed in said thermal management subsystem based on thermal requirement of said gradient coil.

50. A thermal management method for cooling Magnetic Resonance Imaging gradient coils, comprising:
  positioning at least one first header tube adjacent to said gradient coils;
  connecting at least one set of cooling tubes to said at least one first header tube at the inlet ends, wherein said at least one set of cooling tubes are parallel to each other, at least one cooling tube of said at least one set of cooling tubes comprising metallic tube segments, and at least one non-metallic segment connected between the metallic tube segments to reduce eddy current in the at least one set of cooling tubes
  positioning at least one second header tube adjacent to said gradient coils;
  connecting said at least one second header tube to said at least one set of cooling tubes at outlet ends of said at least one set of cooling tubes;
  cycling a coolant fluid through said at least one first header tube, said at least one set of cooling tubes, and said at least one second header tube.

51. The method according to claim 50 further comprising cooling said coolant using a heat exchanger.

52. The method according to claim 50 further comprising cooling said heat exchanger using a chiller.

53. The method according to claim 50 further comprising maintaining an inlet pressure of substantially same magnitude in each of said at least one set of cooling tubes.

54. The method according to claim 50 further comprising maintaining an flow rate of said coolant of substantially same magnitude through each of said at least one set of cooling tubes.

55. The method according to claim 50, wherein connecting said at least one set of cooling tubes comprises positioning said at least one set of cooling tubes at a location adjacent to areas corresponding to higher relative heat generation location of said gradient coils.

56. The method according to claim 50 further comprising positioning a thermal management subsystem adjacent to said gradient coils.

57. The method according to claim 56, wherein said first header tube and said second header tube are positioned on a same side of said gradient coil.

58. The method according to claim 56, wherein said first header tube and said second header tube are on positioned an opposite side of said gradient coil.

59. The method according to claim 56, wherein said coolant fluid is distributed in said thermal management subsystem based on thermal requirement of said gradient coil.

60. The method according to claim 56 further comprising substantially decreasing a thermal spreading resistance of said gradient coil by using relatively higher cooling channel area of said thermal management subsystem.

* * * * *